United States Patent
Kim et al.

(10) Patent No.: US 12,532,676 B2
(45) Date of Patent: Jan. 20, 2026

(54) METHOD OF MANUFACTURING SEMICONDUCTOR DEVICE

(71) Applicant: Samsung Electronics Co., Ltd., Suwon-si (KR)

(72) Inventors: Yurim Kim, Suwon-si (KR); Teawon Kim, Suwon-si (KR); Seunghee Lee, Suwon-si (KR); Seungwoo Jang, Suwon-si (KR); Yongsuk Tak, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 351 days.

(21) Appl. No.: 18/183,571

(22) Filed: Mar. 14, 2023

(65) Prior Publication Data
US 2023/0352297 A1    Nov. 2, 2023

(30) Foreign Application Priority Data
Apr. 28, 2022    (KR) .......................... 10-2022-0052577

(51) Int. Cl.
*H01L 21/02*    (2006.01)

(52) U.S. Cl.
CPC .. *H01L 21/02194* (2013.01); *H01L 21/02205* (2013.01)

(58) Field of Classification Search
CPC ..................... H01L 21/02194; H01L 21/02205
See application file for complete search history.

(56) References Cited

U.S. PATENT DOCUMENTS

| | | |
|---|---|---|
| 2016/0190346 A1 | 6/2016 | Kawata et al. |
| 2021/0118672 A1* | 4/2021 | Madia ................. H01L 21/0262 |
| 2021/0183886 A1 | 6/2021 | Choi et al. |
| 2021/0233769 A1 | 7/2021 | Yamazaki et al. |

FOREIGN PATENT DOCUMENTS

| | | |
|---|---|---|
| KR | 10-2005-0004352 A | 1/2005 |
| KR | 10-2016-0033353 A | 3/2016 |
| KR | 10-2035899 B1 | 2/2019 |
| KR | 10-2021-0046566 A | 4/2021 |
| KR | 10-2321729 B1 | 10/2021 |
| KR | 10-2022-0050784 A | 4/2022 |

OTHER PUBLICATIONS

Office Action in Korean Appln. No. 10-2022-0052577, mailed on Nov. 10, 2025, 13 pages (with English translation).

* cited by examiner

*Primary Examiner* — Richard A Booth
(74) *Attorney, Agent, or Firm* — Fish & Richardson P.C.

(57) ABSTRACT

A method of manufacturing a semiconductor device including providing a first precursor on a substrate to adsorb a first element of the first precursor onto a first region of the substrate, providing a second precursor on the substrate to adsorb a second element of the second precursor onto a second region of the substrate, the second region being different from the first region, and providing a reactant including oxygen on the substrate to form an oxide semiconductor layer including the first element of the first precursor, the second element of the second precursor, and the oxygen of the reactant may be provided.

20 Claims, 9 Drawing Sheets

METHOD OF MANUFACTURING SEMICONDUCTOR DEVICE

CROSS-REFERENCE TO RELATED APPLICATION(S)

This application claims benefit of priority to Korean Patent Application No. 10-2022-0052577 filed on Apr. 28, 2022 in the Korean Intellectual Property Office, the disclosure of which is incorporated herein by reference in its entirety.

BACKGROUND

The present inventive concepts relate to methods of manufacturing a semiconductor device.

Recently, the size of elements constituting semiconductor devices has been reduced in accordance with the trend for high integration of semiconductor devices. As the size of the components is reduced, a small defect occurring in the components increasingly affects the performance or characteristics of semiconductor devices.

SUMMARY

An aspect of the present inventive concepts is to provide a method of manufacturing a semiconductor device in which electrical characteristics are improved.

According to an aspect of the present inventive concepts, a method of manufacturing a semiconductor device includes providing a first precursor on a substrate to adsorb a first element of the first precursor onto a first region of the substrate, providing a second precursor on the substrate to adsorb a second element of the second precursor onto a second region of the substrate, the second region being different from the first region, and providing a reactant including oxygen on the substrate to form an oxide semiconductor layer including the first element of the first precursor, the second element of the second precursor, and the oxygen of the reactant.

According to an aspect of the present inventive concepts, a method of manufacturing a semiconductor device includes providing a first precursor on a substrate to adsorb a first element of the first precursor onto a first region of the substrate, providing a second precursor on the substrate to adsorb a second element of the second precursor onto a second region of the substrate, the second region being different from the first region, providing a first reactant including oxygen on the substrate to form a first oxide semiconductor layer including the first element of the first precursor, the second element of the second precursor, and the oxygen of the first reactant, providing a third precursor on the substrate to adsorb a third element of the third precursor onto the first oxide semiconductor layer, and providing a second reactant including oxygen on the substrate to form a second oxide semiconductor layer including the third element of the third precursor and the oxygen of the second reactant.

According to an aspect of the present inventive concepts, a method of manufacturing a semiconductor device includes forming a device isolation layer on a substrate to define active regions, forming trenches extending in a first direction to intersect the active regions in the substrate, forming, in the trenches, channel layers covering a first portion of the trenches, and forming word lines on the channel layers in the trenches, wherein the forming channel layers includes: providing a first precursor in the trenches to adsorb a first element of the first precursor onto a first region of the first portion, providing a second precursor in the trenches to adsorb a second element of the second precursor onto a second region of the first portion, the second region being different to the first region, and providing a first reactant including oxygen in the trenches to form a first oxide semiconductor layer including the first element of the first precursor, the second element of the second precursor, and the oxygen of the first reactant.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Hereinafter, some example embodiments of the present inventive concepts will be described with reference to the accompanying drawings.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

As used herein, expressions such as "at least one of," when preceding a list of elements, modify the entire list of elements and do not modify the individual elements of the list. Thus, for example, both "at least one of A, B, or C" and "at least one of A, B, and C" mean either A, B, C or any combination thereof.

A method 10 of manufacturing a semiconductor device according to an example embodiment will be described with reference to FIGS. 1 to 3.

Figure 1:
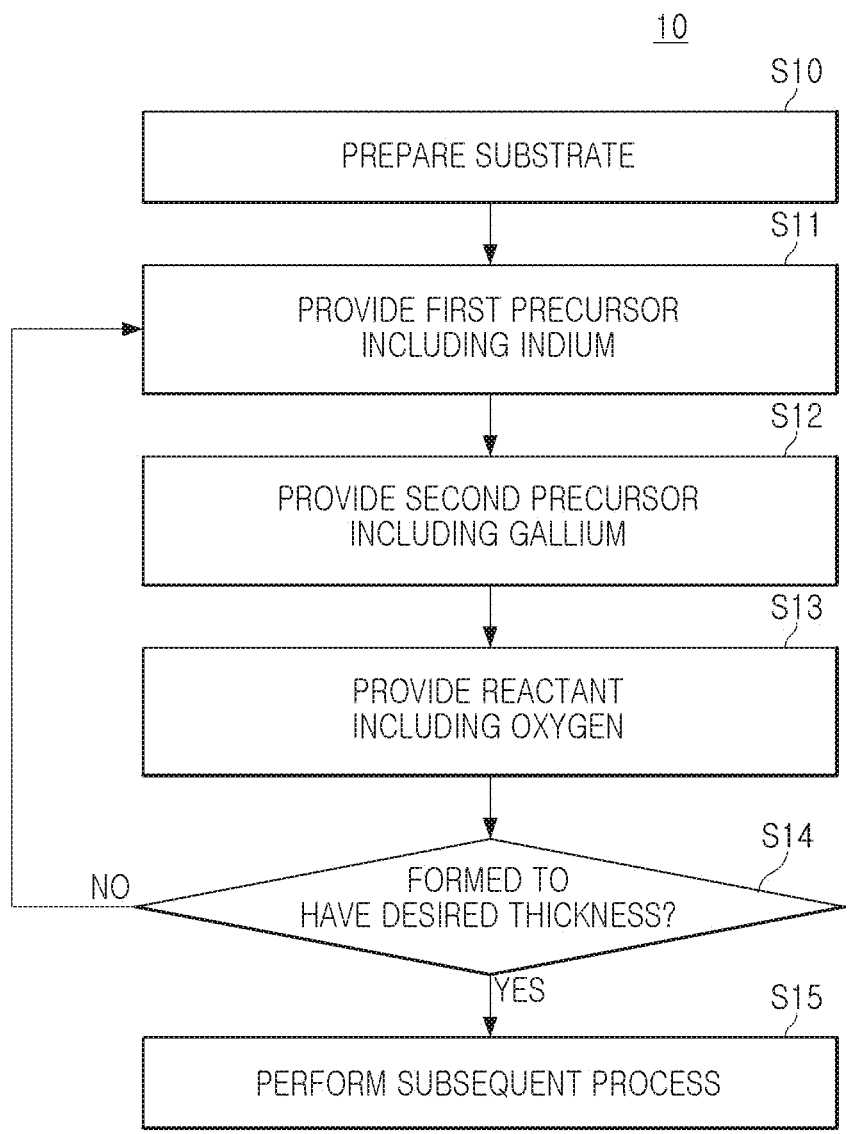
FIG. 1 is a flowchart schematically illustrating a method of manufacturing a semiconductor device according to an example embodiment.

FIG. 1 is a flowchart schematically illustrating the method 10 of manufacturing a semiconductor device according to an example embodiment. FIG. 2 is a cross-sectional view schematically illustrating a method of manufacturing a semiconductor device according to an example embodiment. FIG. 3 is a chart diagram illustrating a supply state of materials according to an example embodiment.

Figure 2:
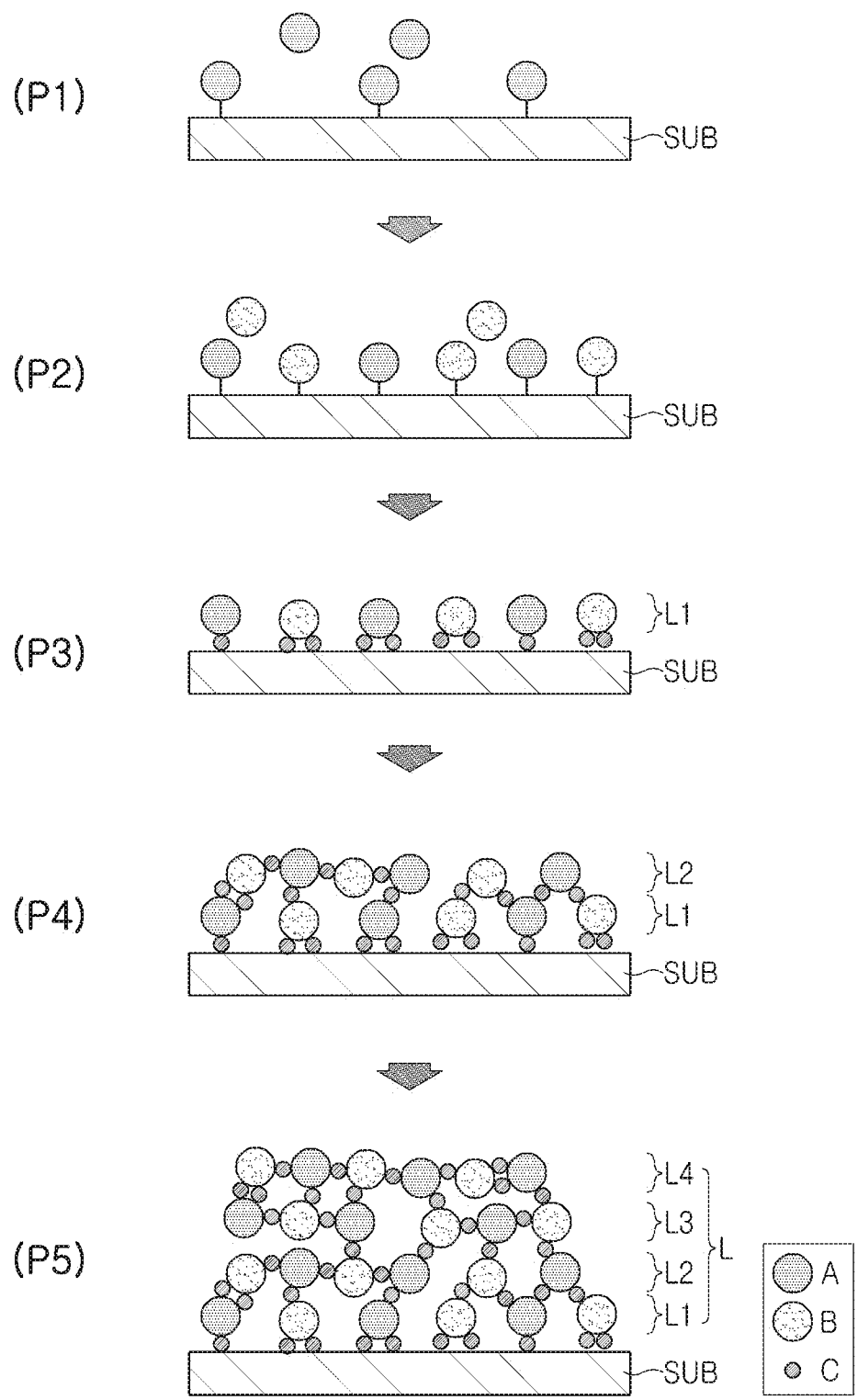
FIG. 2 is a cross-sectional view schematically illustrating a method of manufacturing a semiconductor device according to an example embodiment.
Figure 3:
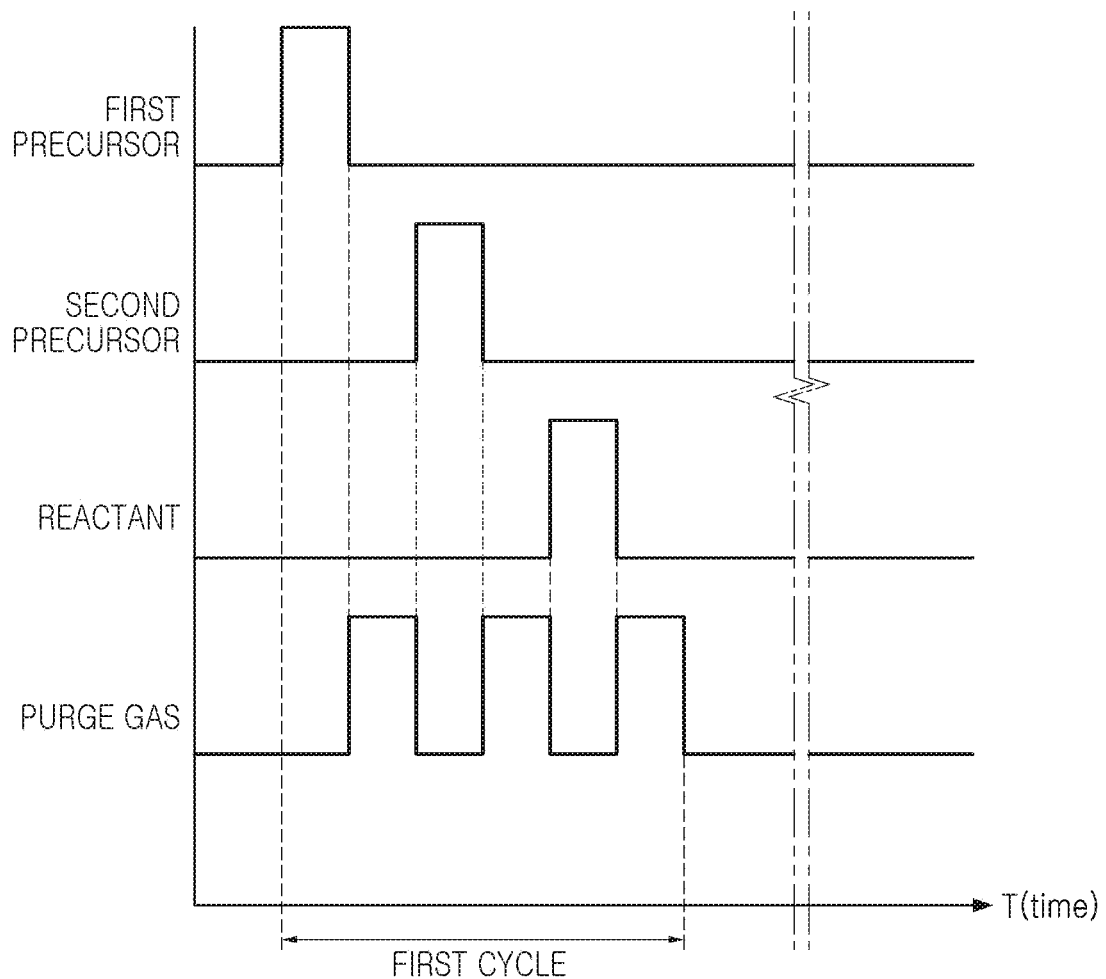
FIG. 3 is a chart diagram illustrating a supply state of materials according to an example embodiment.

Referring to FIGS. 1 to 3, the method 10 of manufacturing a semiconductor device according to an example embodiment includes preparing a substrate (S10), providing a first precursor on the substrate (S11), providing a second precursor on the substrate (S12), and providing a reactant on the substrate (S13). The method 10 of manufacturing a semiconductor device may further include determining whether a material layer is formed to have a desired thickness (S14) and performing a subsequent process on the substrate (S15).

First, a substrate may be prepared into a chamber in which a process is to be performed (S10). The type of the substrate (SUB in FIG. 2) is not limited. The substrate SUB may be, for example, a silicon semiconductor substrate, a glass substrate, a plastic substrate, a compound semiconductor substrate, or the like.

The first precursor may be provided on the substrate and may be adsorbed to a first region of the substrate (S11). Referring to (P1) of FIG. 2, the first element A of the first precursor may be adsorbed to the first region of the substrate SUB, and the first element A of the first precursor may not be adsorbed to a second region, which is different to the first region. Prior to providing the first element A of the first precursor, the method may further include forming an anti-adsorption material in a region in which the first element A is not supposed to be adsorbed.

The type of material that may be used as the first element A of the first precursor is not limited. In some example embodiments, when an indium gallium oxide (IGO) layer is formed on the substrate SUB, the first element A of the first precursor may be indium (In). The first precursor may include, for example, indium nitrate, indium hydroxide, indium fluoride, indium chloride, indium bromide, indium iodide, indium oxide, indium sulfate, indium carboxylate, indium acetylacetonate, or combinations thereof.

A residual first precursor not adsorbed on the substrate SUB may be present on the substrate SUB. If the residual first precursor is present in a chamber, the residual first precursor may react with materials provided in a process described below and an unintended material may be deposited. To mitigate of prevent this, after the first precursor providing operation S11 and before the second precursor providing operation S12, a purge gas injection operation may be additionally performed to remove the residual first precursor. As a purge gas, argon (Ar), nitrogen gas ($N_2$), or the like may be used.

The second precursor may be provided on the substrate and a second element of the second precursor may be adsorbed to a second region, which is different to the first region to which the first element of the first precursor is adsorbed (S12). Referring to (P2) of FIG. 2, a second element B of the second precursor may be adsorbed to the second region on the substrate SUB. The second region to which the second element B of the second precursor is adsorbed may be, for example, a remaining region, except for the region to which the first element A of the first precursor is adsorbed.

The kind of material that may be used as the second element B of the second precursor is not limited. In some example embodiments, when an indium gallium oxide (IGO) layer is formed on the substrate SUB, the second element B of the second precursor may be gallium (Ga). The second precursor may include, for example, gallium acetylacetonate, gallium fluoride, gallium chloride, gallium bromide, gallium iodide, gallium oxide, gallium nitrate, gallium sulfate, gallium carboxylate, or combinations thereof.

By the operation of providing the first precursor (S11) and the operation of providing the second precursor (S12), a layer including the first element A of the first precursor and the second element B of the second precursor may be formed on the substrate SUB. In some example embodiments, the first element A of the first precursor may be adsorbed to the first region of the substrate SUB, and the second element B of the second precursor may be adsorbed to the second region of the substrate SUB. The first region and the second region may not overlap each other. (P2) of FIG. 2 illustrates an example embodiment in which the first element A of the first precursor and the second element B of the second precursor are adsorbed in the same amount, but the present inventive concepts are not limited thereto. The adsorption amount of the first element A of the first precursor and the adsorption amount of the second element B of the second precursor may be different from each other.

The residual second precursor that is not adsorbed on the substrate SUB may react with materials provided in an operation to be described below, and an unintended material may be deposited. In order to mitigate or prevent this, after the second precursor providing operation (S12) and before the reactant providing operation (S13), an operation of injecting a purge gas may be performed. As a purge gas, argon (Ar), nitrogen gas ($N_2$), or the like may be used.

In FIG. 1, it is illustrated that, after the operation (S11) of providing the first precursor including indium, the operation (S12) of providing the second precursor including gallium is performed, but the process sequence is not limited thereto. It is also possible to provide the second precursor including gallium on the substrate first (S12) and then provide the first precursor including indium later (S11).

The types of elements included in the first precursor and the second precursor are not limited to indium and gallium, respectively, and may vary depending on the type of material layer to be formed. For example, in the case of forming an IZO layer on the substrate, the first precursor and the second precursor may include indium and zinc, respectively.

Next, a reactant may be provided on the substrate (S13). Referring to (P3) of FIG. 2, the first element A of the first precursor and the second element B of the second precursor may each react with a reactive element C of the reactant. Thus, a first unit layer L1 including the first element A of the first precursor, the second element B of the second precursor, and the reactive element C of the reactant may be formed. The first unit layer L1 may be, for example, an oxide semiconductor layer. The reactive element C of the reactant may replace a bond between the substrate SUB and the first element A of the first precursor and a bond between the substrate SUB and the second element B of the second precursor.

The type of material that may be used as a reactant is not limited. In some example embodiments, when an indium gallium oxide (IGO) layer is formed on the substrate SUB, the reactive element C of the reactant may be oxygen (O).

The reactant may include, for example, oxygen ($O_2$), ozone ($O_3$), nitrogen dioxide ($NO_2$), nitrogen monoxide (NO), water vapor ($H_2O$), hydrogen peroxide ($H_2O_2$), formic acid (HCOOH), acetic acid ($CH_3COOH$), acetic anhydride (($CH_3CO)_2O$), or combinations thereof.

A residual reactant that is not adsorbed on the substrate SUB may react with materials provided in an operation to be described below, and an unintended material may be deposited. In order to prevent this, after the operation (S13) of providing the reactant, an operation of injecting a purge gas may be additionally performed.

Referring to FIG. 3 together, the first precursor, a purge gas, the second precursor, a purge gas, the reactant, and a purge gas may be sequentially supplied to form one unit layer on the substrate. Provision of the first precursor, the purge gas, the second precursor, the purge gas, the reactant, and the purge gas may be sequentially performed to achieve one cycle. The unit layer may be a material layer including the first element A of the first precursor, the second element B of the second precursor, and the reactive element C of the reactant. The unit layer may be, for example, an oxide semiconductor layer.

An embodiment of providing two precursors on the substrate is disclosed in FIGS. 1 to 3, but is not limited thereto. In some example embodiments, the substrate may be divided into three or more regions, and the three or more elements of the precursors may be provided to the three or more regions, respectively. For example, in the case of forming an IGZO layer on a substrate, a first precursor, a second precursor, and a third precursor each including indium, gallium, and zinc may be provided on the substrate. The first element of the first precursor may be adsorbed to the first region of the substrate, the second element of the second precursor may be adsorbed to the second region of the substrate, and the third element of the third precursor may be adsorbed to the third region of the substrate. The first to third regions may not overlap each other. Each unit layer constituting the material layer may include the first element of the first precursor, the second element of the second precursor, the third element of the third precursor, and the reactive element of the reactant. Each unit layer may be, for example, an oxide semiconductor layer.

Next, it may be determined whether the material has a desired thickness on the substrate (S14).

When it is determined that the material layer has a desired thickness on the substrate, a subsequent process may be performed on the substrate (S15).

When it is determined that the material layer has a thickness less than a desired thickness on the substrate, the cycle including the operation (S11) of providing the first precursor, the operation (S12) of providing the second precursor, and the operation (S13) of providing the reactant may be repeatedly performed. Thus, as shown in (P4) and (P5) of FIG. 2, a material layer L having a plurality of unit layers L1, L2, L3, and L4 may be formed.

Figure 4A:
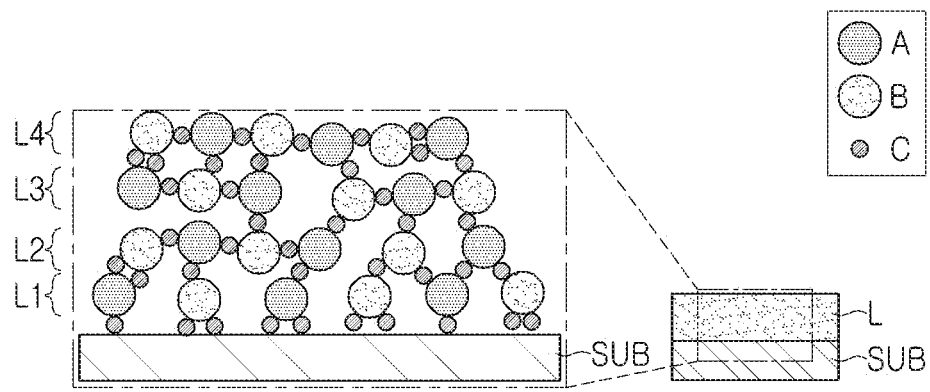
FIG. 4A is a cross-sectional view schematically illustrating a semiconductor device according to an example embodiment.
Figure 4B:
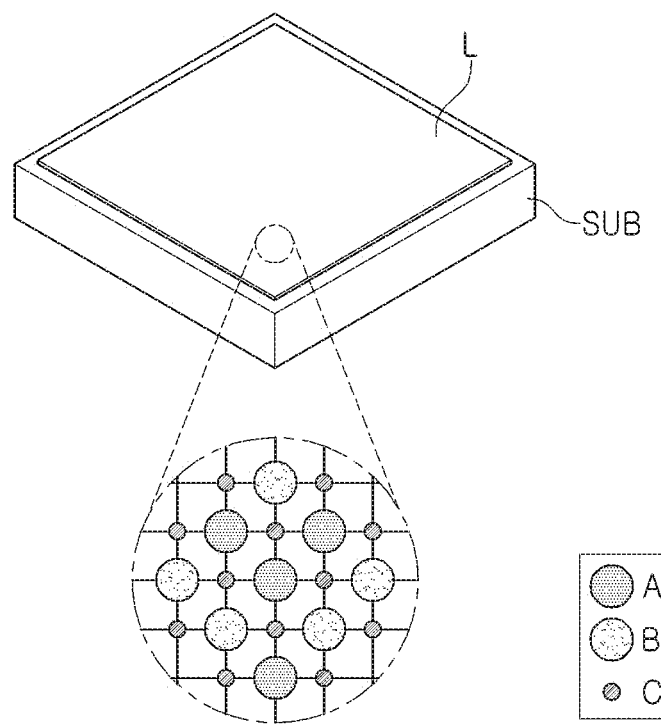
FIG. 4B is a perspective view schematically illustrating a semiconductor device according to an example embodiment.

Next, FIG. 4A is a cross-sectional view schematically illustrating a semiconductor device according to an example embodiment, and FIG. 4B is a perspective view schematically illustrating a semiconductor device according to an example embodiment.

Referring to FIG. 4A, the material layer L formed on the substrate SUB may include a plurality of unit layers L1, L2, L3, and L4. In each of the unit layers L1, L2, L3, and L4, a region to which the first element A of the first precursor is adsorbed and a region to which the second element B of the second precursor is adsorbed may be different to each other. For example, in the first unit layer L1, the first element A of the first precursor may be adsorbed to a first region on the substrate SUB, and the second element B of the second precursor may be adsorbed to a second region, which is different from the first region, on the substrate SUB. In the second unit layer L2, the first element A of the first precursor may be adsorbed to a third region of the first unit layer L1. In the second unit layer L2, the second element B of the second precursor may be adsorbed to a fourth region of the first unit layer L1, which is different to the third region. The third region may overlap portions of the first and second regions. The fourth region may overlap portions of the first and second regions. In each of the unit layers L1, L2, L3, and L4, the first element A of the first precursor and the second element B of the second precursor may be distributed in positions offset from each other.

In some example embodiments, when an IGO layer is formed on a substrate, the IGO layer may include gallium oxide and indium oxide distributed over the entire region. Because gallium has a higher oxygen affinity than indium, gallium distributed over the entire region of the IGO layer may reduce the ratio of oxygen vacancy. Further, by mitigating or preventing the indium from being densely distributed in a specific region of the material layer L, a problem in which a concentration of oxygen vacancy is increased in the specific region may be mitigated or prevented.

Thus, as shown in FIG. 4B, the reactive element C of the reactant may be bonded to a bonding site between the first element A of the first precursor and the second element B of the second precursor without a vacancy. For example, when the first element A of the first precursor, the second element B of the second precursor, and the reactive element C of the reactant include indium, gallium, and oxygen, respectively, because indium of the first precursor has a lower oxygen affinity compared to gallium of the second precursor, a vacancy may occur in a bonding site of indium of the first precursor. However, by distributing gallium of the second precursor throughout the material layer L, oxygen of the reactant may be coupled to bonding sites of gallium of the second precursor, thereby reducing a vacancy concentration. Thus, carrier mobility, threshold voltage characteristics, and the like of the material layer L may be improved, so that a semiconductor device having improved electrical characteristics may be provided. A distribution profile of each element included in the precursors and reactants may be confirmed through an analysis such as TEM-EDX (Transmission Electron Microscopy Energy-Dispersive X-ray spectroscopy).

FIG. 4A illustrates a material layer L formed by providing the first element A of the first precursor and the second element B of the second precursor at the same concentration, but is not limited thereto. Concentrations of the first element A of the first precursor, the second element B of the second precursor, and the reactive element C of the reactant may vary according to example embodiments. In some example embodiments, when the material layer L is an IGO layer, the amount of indium relative to the total elements including indium, gallium, and oxygen may be about 10% to about 60%. Also, the amount of gallium relative to the total elements including indium, gallium, and oxygen may be about 10% to about 60%.

A method of manufacturing a semiconductor device 20 according to an example embodiment will be described with reference to FIGS. 5 and 6.

Figure 5:
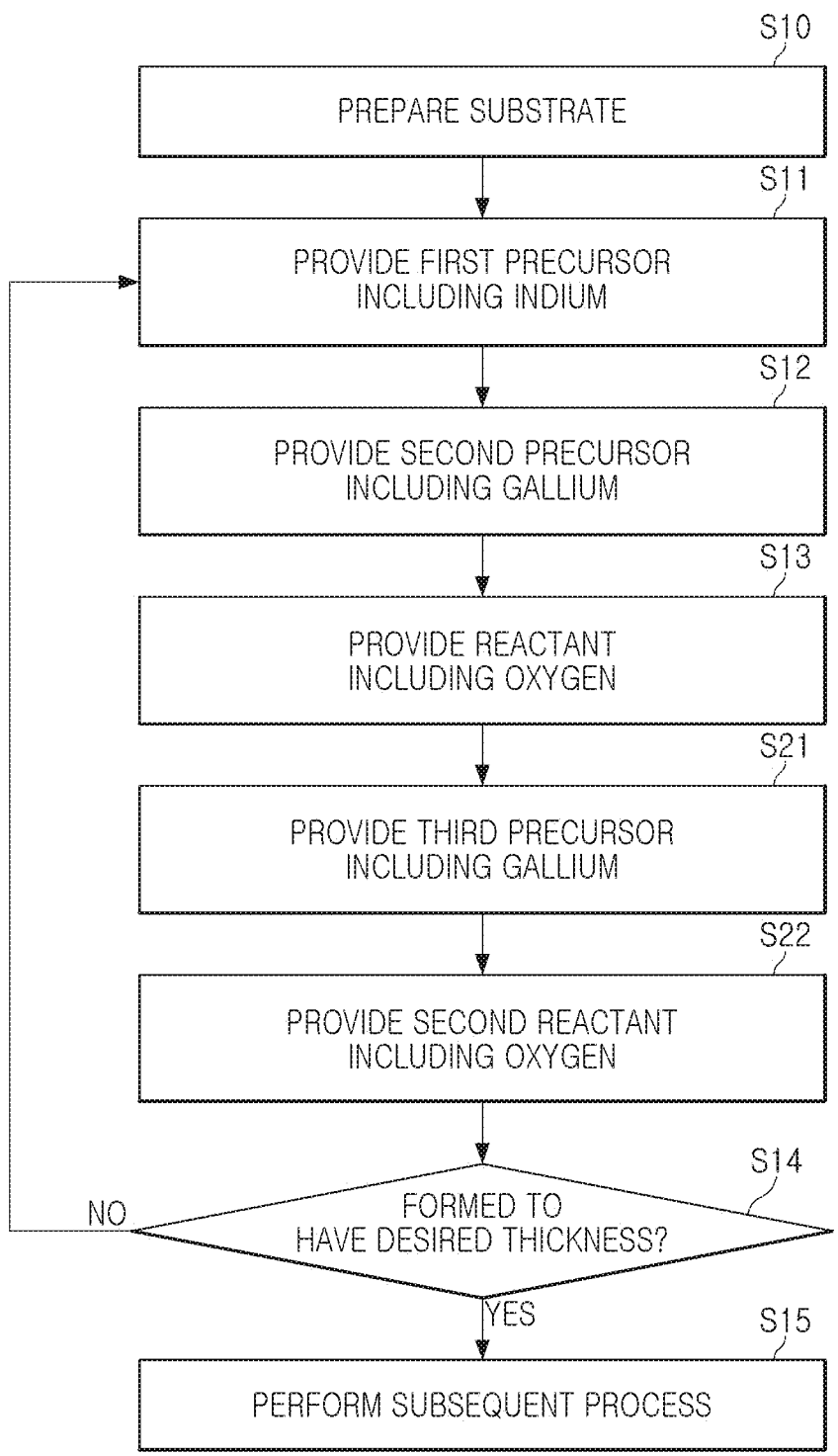
FIG. 5 is a flowchart schematically illustrating a method of manufacturing a semiconductor device according to an example embodiment.

FIG. 5 is a flowchart schematically illustrating a method 20 of manufacturing a semiconductor device according to an example embodiment. FIG. 6 is a cross-sectional view schematically illustrating the method 20 of manufacturing a semiconductor device according to an example embodiment.

Figure 6:
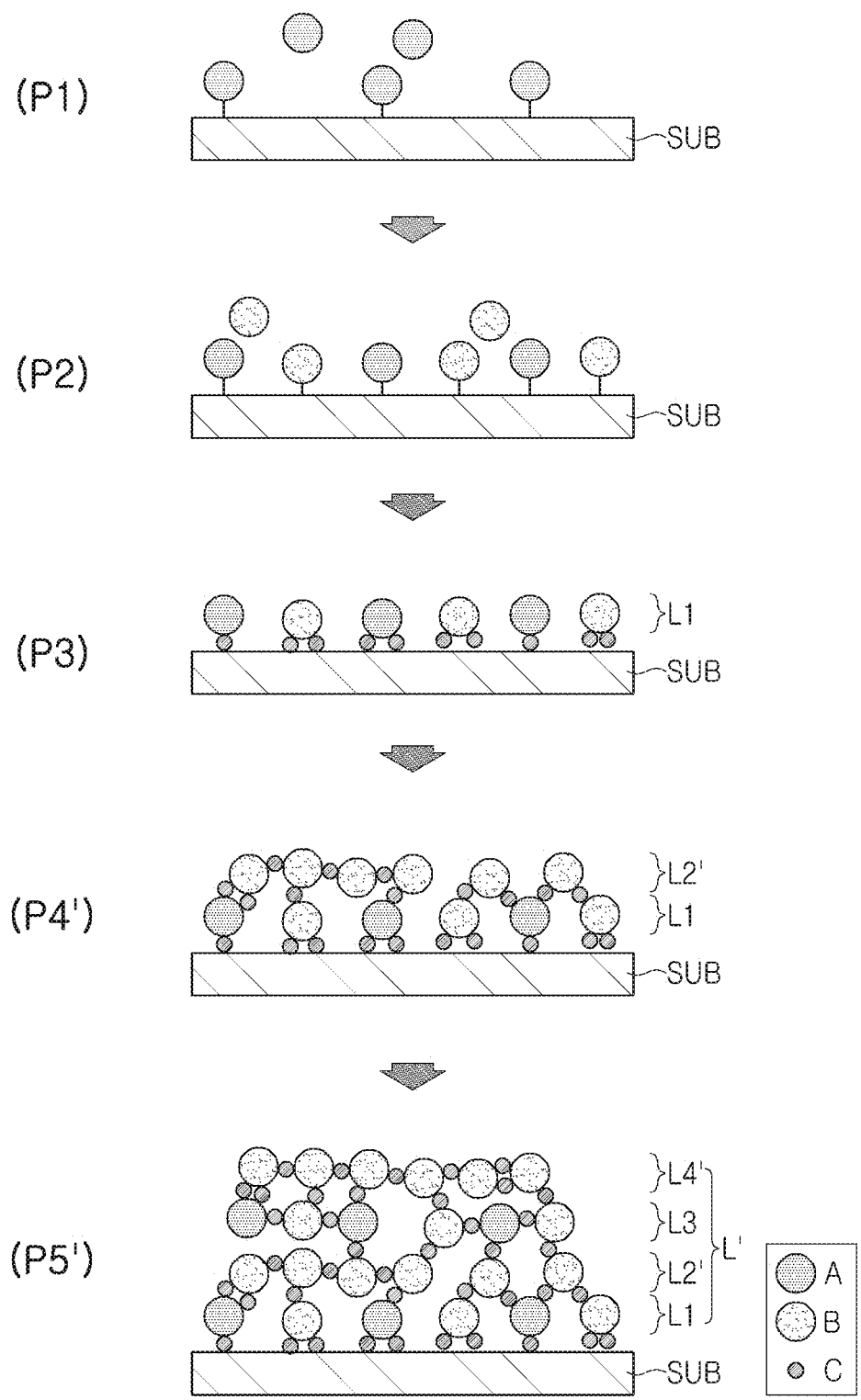
FIG. 6 is a cross-sectional view schematically illustrating a method of manufacturing a semiconductor device according to an example embodiment.

Referring to FIGS. 5 and 6, the method 20 of manufacturing a semiconductor device according to an example embodiment may include preparing a substrate (S10), providing a first precursor (S11), providing a second precursor (S12), providing a first reactant (S13), providing a third precursor (S21), providing a second reactant (S22), and performing a subsequent process (S15).

The method 20 of manufacturing a semiconductor device of FIG. 5 is different from the method 10 of manufacturing a semiconductor device of FIG. 1 in that the method 20 of manufacturing a semiconductor device of FIG. 5 further includes the operation of providing a third precursor (S21) and the operation of providing a second reactant (S22).

The first precursor may be provided on a substrate and the first element of the first precursor may be adsorbed to the first region of the substrate (S10). Referring to (P1) of FIG. 6, the first element A of the first precursor may be adsorbed only to the first region on the substrate SUB, and the first element A of the first precursor may not be adsorbed to the second region.

Next, the second precursor may be provided on the substrate and the second element of the second precursor may be adsorbed to the second region different from the first region of the substrate (S11). Referring to (P2) of FIG. 6, the second element B of the second precursor may be adsorbed on the substrate SUB. The second element B of the second precursor may be adsorbed to the second region of the substrate SUB, except for the region in which the first element A of the first precursor is adsorbed.

Next, a first reactant may be provided on the substrate (S12). Referring to (P3) of FIG. 6, a first unit layer L1 including the first element A of the first precursor, the second element B of the second precursor, and the first reactive element C of the first reactant may be formed on the substrate SUB (S23). The first unit layer L1 may be, for example, an oxide semiconductor layer.

The providing of the first precursor (S11 in FIG. 5, P1 in FIG. 6), the providing of the second precursor (S12 in FIG. 5, P2 in FIG. 6), and the providing of the first reactant (S13 in FIG. 5, P3 in FIG. 6) may be performed in the same or substantially similar manner to those described above with reference to the same reference numerals in FIGS. 1 and 2.

In addition, after the operation (S11) of providing the first precursor, after the operation (S12) of providing the second precursor, and after the operation (S13) of providing the first reactant, an operation of providing a purge gas may be additionally performed so that a residual material that is not attached to the substrate may be removed.

Thereafter, the operation (S21) of providing the third precursor and the operation (S22) of providing the second reactant may be performed. Referring to (P4') of FIG. 6, a second unit layer L2' may be formed by the operation (S21) of providing the third precursor and the operation (S22) of providing the second reactant.

First, the third precursor may be provided on the substrate SUB and the third element B of the third precursor may be adsorbed to the first unit layer L1. The type of material that may be used as the third precursor is not limited. Although it is illustrated in (P4') of FIG. 6 that the third element of the third precursor is the same as the second element B of the second precursor, the present inventive concepts are not limited thereto. In some example embodiments, the third element of the third precursor may be the same as the first element of the first precursor, or the third element of the third precursor may be different from both the first element of the first precursor and the second element of the second precursor.

Thereafter, the second reactant including the second reactive element C may be provided on the substrate SUB. Accordingly, a second unit layer L2' including the third element B of the third precursor and the second reactive element C of the second reactant may be formed on the first unit layer L1.

The type of material that may be used as the second reactant is not limited. In (P4') of FIG. 6, the second reactive element of the second reactant is illustrated to be the same as the first reactive element C of the first reactant, but the present inventive concepts are not limited thereto. In some example embodiments, the second reactant may be different from the first reactant.

In some example embodiments, in the case of forming an IGO layer on the substrate SUB, the first precursor may include indium, the second and third precursors may each include gallium, and the first and second reactants may each include oxygen. The first unit layer L1 may be an oxide semiconductor layer including indium and gallium, and the second unit layer L2' may be a gallium oxide layer. By forming the second unit layer L2', which is a gallium oxide layer with high oxygen affinity, oxygen vacancy in the IGO layer may be further reduced.

Thereafter, it may be determined whether the material layer deposited on the substrate has a desired thickness (S14).

When it is determined that the material layer has a desired thickness on the substrate, a subsequent process may be performed on the substrate (S15).

When it is determined that the material layer on the substrate has a thickness less than a desired thickness, the operation (S11) of providing the first precursor, the operation (S12) of providing the second precursor, the operation (S13) of providing the first reactant, the operation (S21) of providing the third precursor (S21), and the operation (S22) of providing the second reactant may be repeatedly performed. Thus, as shown in (P5') of FIG. 6, a material layer L' having a plurality of unit layers L1, L2', L3 and L4' may be formed.

The method of manufacturing a semiconductor device according to the above example embodiments may be applied to all components constituting the semiconductor device without limitation. In some example embodiments, the method of manufacturing a semiconductor device may be applied to a process of forming a channel layer of a transistor.

A method of manufacturing a semiconductor device according to an example embodiment will be described with reference to FIGS. 7A to 7E. FIGS. 7A to 7E are schematic cross-sectional views illustrating a method of manufacturing a semiconductor device according to an example embodiment.

Figure 7A:
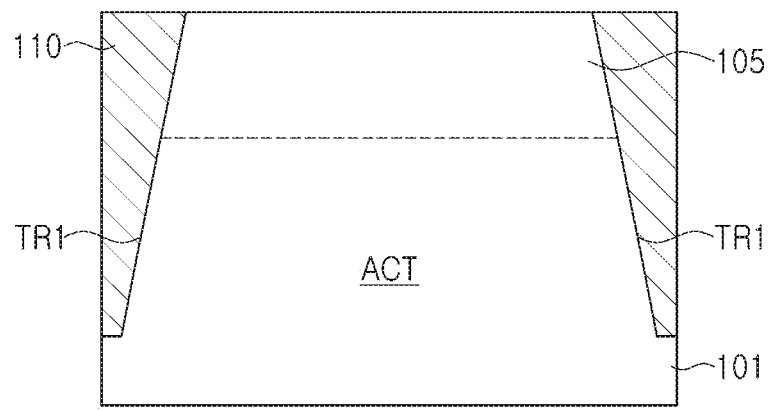
FIGS. 7A to 7E are cross-sectional views schematically illustrating a method of manufacturing a semiconductor device according to an example embodiment.

Referring to FIG. 7A, active regions ACT may be defined by forming a device isolation layer 110 on a substrate 101.

First, first trenches TR1 may be formed by anisotropically etching the substrate 101 using a mask layer according to a shallow trench isolation (STI) process. After depositing an insulating material in the first trenches TR1, a planarization process may be performed to form the device isolation layer 110. Before the device isolation layer 110 is formed, impurities may be implanted into the substrate 101 to form an impurity region 105. However, in some example embodiments, the impurity region 105 may be formed after the device isolation layer 110 is formed or in another process.

Figure 7B:
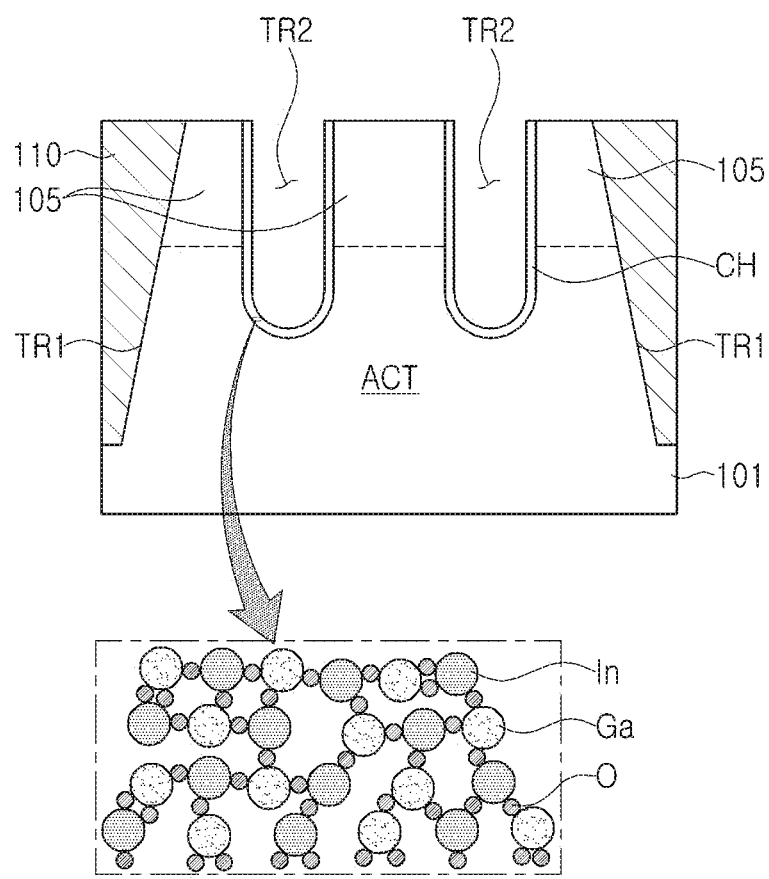

Referring to FIG. 7B, second trenches TR2 extending in a first direction may be formed in the substrate 101, and a channel layer CH may be formed in the second trenches TR2.

The second trenches TR2 may be formed by anisotropically etching the substrate 101 using a mask layer, for example, using a plasma etching process. The second trenches TR2 may cross the active regions ACT and the device isolation layer 110 and extend in the first direction. For example, two second trenches TR2 may cross each of the active regions ACT.

The channel layer CH may be formed in each of the second trenches TR2. In some example embodiments, the channel layer CH may be formed by the method described above with reference to FIGS. 1 to 6. The channel layer CH may be an oxide semiconductor layer, for example, an IGO layer. Because gallium having high oxygen affinity is distributed in the entire region of the channel layer CH, oxygen vacancy in the channel layer CH may be reduced.

The channel layer CH may be formed on an inner surface of the second trench at a lower portion of the second trench. The channel layer CH may be conformally formed to have a substantially uniform thickness along the shape of the second trench.

Figure 7C:
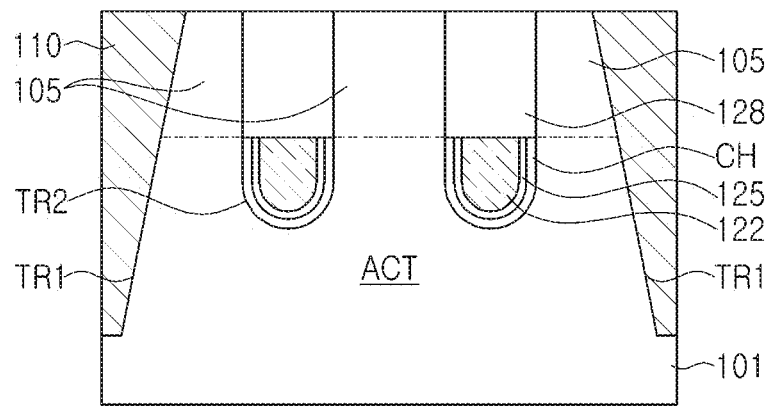

Referring to FIG. 7C, a gate structure may be formed on the channel layer CH in each of the second trenches.

First, a gate dielectric layer 125 may be formed on the channel layer CH. The gate dielectric layer 125 may be formed to have a substantially uniform thickness on the channel layer CH. The gate dielectric layer 125 may be formed on the channel layer CH to cover a surface of the channel layer CH.

In some example embodiments, the gate dielectric layer 125 may be formed by a deposition process of a dielectric material. For example, the gate dielectric layer 125 may be formed by physical vapor deposition (PVD), chemical vapor deposition (CVD), or atomic layer deposition (ALD). However, the method of forming the gate dielectric layer 125 is not limited thereto. In some example embodiments, the gate dielectric layer 125 may be formed by an oxidation process, such as a thermal oxidation process.

Thereafter, a gate electrode layer 122 filling the second trenches TR2 may be formed on the gate dielectric layer 125. The gate electrode layer 122 may be formed by depositing a conductive material in the second trenches TR2.

Thereafter, the channel layer CH, the gate dielectric layer 125, and the gate electrode layer 122 may be recessed from the top to a desired (or alternatively, predetermined) depth. In some example embodiments, top surfaces of the channel layer CH, the gate dielectric layer 125, and the gate electrode layer 122 may be positioned on at same substantially similar height levels with each other.

A gate capping layer 128 may be formed in the second trench to cover the channel layer CH, the gate dielectric layer 125, and the gate electrode layer 122. The gate capping layer 128 may be formed by depositing an insulating material to fill the second trenches TR2 and to cover the upper surface of the substrate, and then performing a planarization process. The top surface of the gate capping layer 128 may be positioned on the same or substantially similar height level as the upper surface of the substrate 101. The gate electrode layer 122, the gate dielectric layer 125, and the gate capping layer 128 may form a gate structure.

Figure 7D:
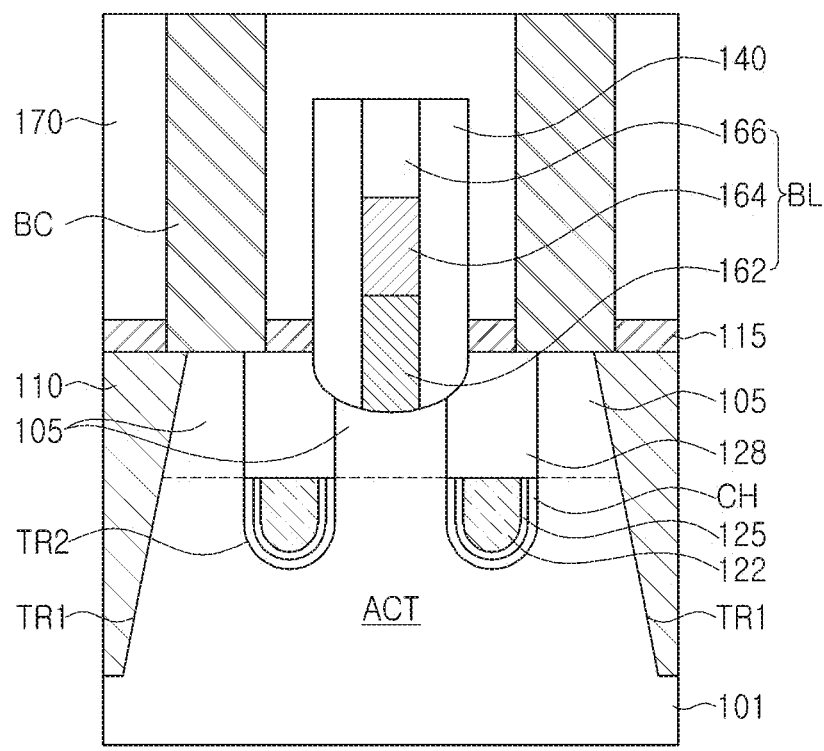

Referring to FIG. 7D, a bit line BL may be formed on the gate structure.

First, a lower insulating layer 115 may be formed on the substrate 101. The bit line BL may be formed by sequentially stacking and patterning a first bit line conductive layer 162, a second bit line conductive layer 164, and a bit line capping layer 166. When the first bit line conductive layer 162 is formed, a direct contact may be formed together in a region from which the substrate 101 is partially removed. The bit line BL may extend in a second direction, intersecting the first direction that is an extension direction of the gate structure. The bit line BL may be formed to be connected to the active regions ACT between adjacent gate structures intersecting one active region ACT.

Thereafter, bit line spacers 140 covering side surfaces of the bit line BL may be formed, and an interlayer insulating layer 170 may be formed. Thereafter, storage node contact plugs BC connected to the active regions ACT through the lower insulating layer 115 and the interlayer insulating layer 170 may be formed.

Figure 7E:
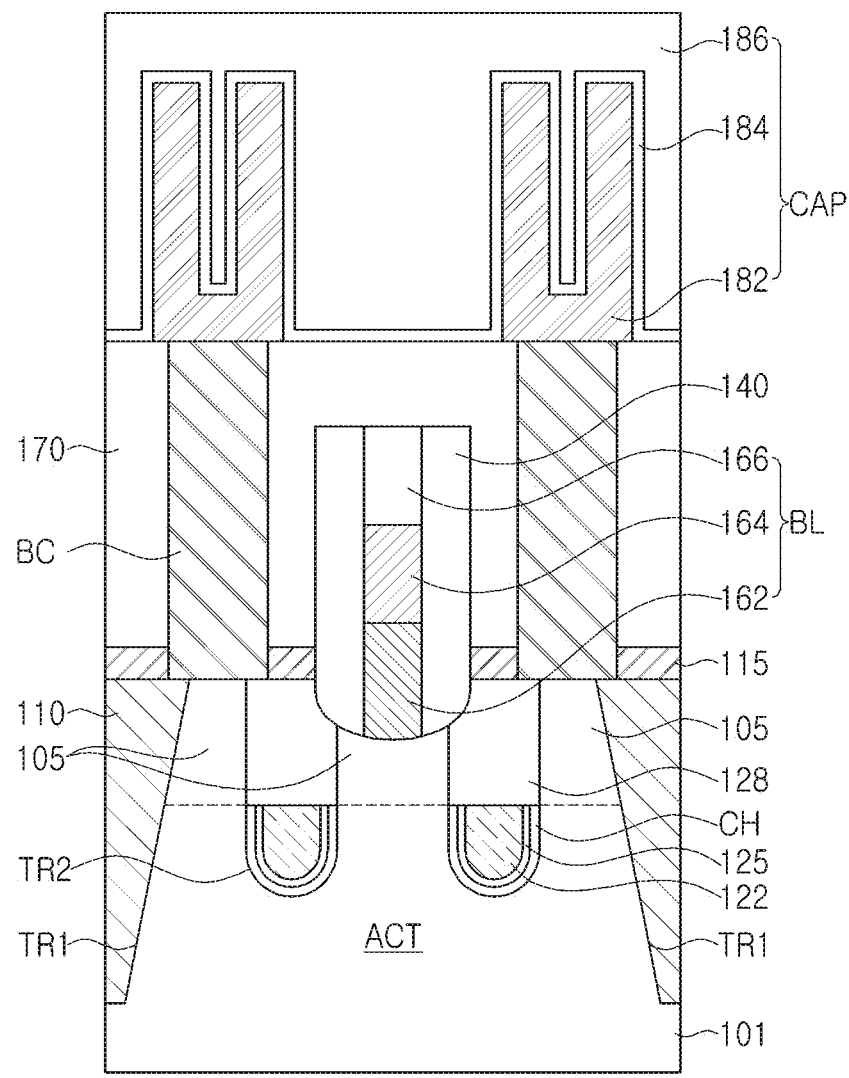

Referring to FIG. 7E, a capacitor CP may be formed on the interlayer insulating layer 170.

A lower electrode 182 may be formed on the storage node contact plugs BC. The lower electrode 182 is illustrated to have a cylinder shape, but is not limited thereto, and may have a pillar or planar shape, for example. Thereafter, a capacitor dielectric layer 184 covering an upper surface of the interlayer insulating layer 170 and a surface of the lower electrode 182 may be formed. The capacitor dielectric layer 184 may have a substantially uniform thickness. Thereafter, an upper electrode 186 covering the lower electrode 182 and the capacitor dielectric layer 184 may be formed. Thereby, the semiconductor device 100 may be manufactured.

According to some example embodiments of the inventive concepts, oxygen vacancy may be reduced by distributing a precursor having high affinity with a reactant throughout the film. In addition, the performance of the semiconductor device may be improved by controlling carrier mobility and threshold voltage.

While example embodiments have been shown and described above, it will be apparent to those skilled in the art that modifications and variations could be made without departing from the scope of the present inventive concepts as defined by the appended claims.

What is claimed is:

1. A method of manufacturing a semiconductor device, the method comprising:
   providing a first precursor on a substrate to adsorb a first element of the first precursor onto a portion of the substrate, a remaining portion of the substrate being free of the first element;
   providing a second precursor on the substrate to adsorb a second element of the second precursor onto the remaining portion of the substrate while the first element of the first precursor is adsorbed onto the portion of the substrate; and
   providing a reactant including oxygen on the substrate to form an oxide semiconductor layer on the substrate, the oxide semiconductor layer including, in a single unit layer, (i) the first element of the first precursor and the oxygen of the reactant on the portion of the substrate and (ii) the second element of the second precursor and the oxygen of the reactant on the remaining portion of the substrate.

2. The method of claim 1, wherein the first element of the first precursor is any one of indium (In) and gallium (Ga), and the second element of the second precursor is the other one of indium (In) and gallium (Ga).

3. The method of claim 1, wherein the oxide semiconductor layer includes an oxygen vacancy, and a concentration of the oxygen vacancy is greater than 0 and less than or equal to 10%.

4. The method of claim 1, wherein
the providing a first precursor, the providing a second precursor, and the providing a reactant are performed a plurality of times.

5. The method of claim 1, wherein the first precursor includes at least one of indium nitrate, indium hydroxide, indium fluoride, indium chloride, indium bromide, indium iodide, indium oxide, indium sulfate, indium carboxylate, and indium acetylacetonate.

6. The method of claim 1, wherein the second precursor includes at least one of gallium acetylacetonate, gallium fluoride, gallium chloride, gallium bromide, gallium iodide, gallium oxide, gallium nitrate, gallium sulfate, and gallium carboxylate.

7. The method of claim 1, wherein the reactant includes at least one of oxygen ($O_2$), ozone ($O_3$), water vapor ($H_2O$) and hydrogen peroxide ($H_2O_2$).

8. The method of claim 1, further comprising:
providing a purge gas after each of the providing a first precursor, the providing a second precursor, and the providing a reactant.

9. The method of claim 8, wherein the purge gas includes argon (Ar) or nitrogen ($N_2$).

10. A method of manufacturing a semiconductor device, the method comprising:
providing a first precursor on a substrate to adsorb a first element of the first precursor onto a portion of the substrate, a remaining portion of the substrate being free of the first element;
providing a second precursor on the substrate to adsorb a second element of the second precursor onto the remaining portion of the substrate while the first element of the first precursor is adsorbed onto the portion of the substrate;
providing a first reactant including oxygen on the substrate to form a first oxide semiconductor layer on the substrate, the first oxide semiconductor layer including, in a single unit layer, (i) the first element of the first precursor and the oxygen of the first reactant on the portion of the substrate and (ii) the second element of the second precursor and the oxygen of the first reactant on the remaining portion of the substrate;
providing a third precursor on the substrate to adsorb a third element of the third precursor onto the first oxide semiconductor layer; and
providing a second reactant including oxygen on the substrate to form a second oxide semiconductor layer including the third element of the third precursor and the oxygen of the second reactant.

11. The method of claim 10, wherein the third element of the third precursor is same as the first element of the first precursor or the second element of the second precursor.

12. The method of claim 10, wherein
the first element of the first precursor is any one of indium (In) and gallium (Ga),
the second element of the second precursor is the other of indium (In) and gallium (Ga), and
the third element of the third precursor is gallium (Ga).

13. The method of claim 10, wherein the first reactant and the second reactant include a same material.

14. A method of manufacturing a semiconductor device, the method comprising:
forming a device isolation layer on a substrate to define active regions;
forming trenches extending in a first direction to intersect the active regions in the substrate;
forming, in the trenches, channel layers covering a first portion of the trenches; and
forming word lines on the channel layers in the trenches,
wherein the forming channel layers includes,
providing a first precursor in the trenches to adsorb a first element of the first precursor onto a portion of the first portion, a remaining portion of the first portion being free of the first element,
providing a second precursor in the trenches to adsorb a second element of the second precursor onto the remaining portion of the first portion while the first element of the first precursor is adsorbed onto the portion of the first portion, and
providing a first reactant including oxygen in the trenches to form a first oxide semiconductor layer on the first portion, the first oxide semiconductor layer including, in a single unit layer, (i) the first element of the first precursor and the oxygen of the first reactant on the portion of the first portion and (ii) the second element of the second precursor and the oxygen of the first reactant on the remaining portion of the first portion.

15. The method of claim 14, wherein
after the providing a first reactant, the forming channel layers further includes,
providing a third precursor in the trenches to adsorb a third element of the third precursor onto the first oxide semiconductor layer, and
providing a second reactant including oxygen in the trenches to form a second oxide semiconductor layer including the third element of the third precursor and the oxygen of the second reactant.

16. The method of claim 14, wherein the providing a first precursor, the providing a second precursor, and the providing a first reactant are performed a plurality of times.

17. The method of claim 14, further comprising:
forming bit lines connected to the active regions between the word lines adjacent to each other and extending in a second direction, the second direction intersecting the first direction, on the word lines;
forming contact plugs on the active regions between the bit lines adjacent to each other; and
forming a capacitor on the contact plugs.

18. The method of claim 14, wherein the forming channel layers further includes,
providing a first purge gas between the providing a first precursor and the providing a second precursor,
providing a second purge gas between the providing a second precursor and the providing a first reactant, and
providing a third purge gas after the providing a first reactant.

19. The method of claim 14, wherein
each of the channel layers includes an oxygen vacancy, and
a concentration of the oxygen vacancy is greater than 0 and less than or equal to 10%.

20. The method of claim 14, wherein
the first element of the first precursor is indium (In), the second element of the second precursor is gallium (Ga), and
in each of the channel layers, a ratio of a number of atoms of indium to a sum of a number of atoms of oxygen, the number of atoms of indium, and a number of atoms of gallium is between 10% and 60%, and a ratio of the number of atoms of gallium to the sum of the number of atoms of oxygen, the number of atoms of indium, and the number of atoms of gallium is between 10% and 60%.

\* \* \* \* \*